(12) United States Patent
Drescher et al.

(10) Patent No.: US 11,201,081 B2
(45) Date of Patent: *Dec. 14, 2021

(54) METHOD FOR SEPARATING THIN LAYERS OF SOLID MATERIAL FROM A SOLID BODY

(71) Applicant: Siltectra GmbH, Dresden (DE)

(72) Inventors: Wolfram Drescher, Dresden (DE); Jan Richter, Dresden (DE)

(73) Assignee: Siltectra GmbH, Dresden (DE)

( * ) Notice: Subject to any disclaimer, the term of this patent is extended or adjusted under 35 U.S.C. 154(b) by 34 days.

This patent is subject to a terminal disclaimer.

(21) Appl. No.: 16/563,442

(22) Filed: Sep. 6, 2019

(65) Prior Publication Data

US 2020/0006119 A1 Jan. 2, 2020

Related U.S. Application Data

(63) Continuation of application No. 16/200,163, filed on Nov. 26, 2018, now abandoned, which is a
(Continued)

(30) Foreign Application Priority Data

Oct. 8, 2013 (DE) .......................... 102013016669.1

(51) Int. Cl.
*H01L 21/762* (2006.01)
*B23K 26/50* (2014.01)
(Continued)

(52) U.S. Cl.
CPC ........ *H01L 21/76254* (2013.01); *B23K 26/50* (2015.10); *B23K 26/53* (2015.10);
(Continued)

(58) Field of Classification Search
CPC .... B23K 26/50; B23K 26/53; B23K 2103/52; B23K 26/0006; B23K 26/0057;
(Continued)

(56) References Cited

U.S. PATENT DOCUMENTS

2007/0249140 A1 10/2007 Dross et al.
2008/0012140 A1 1/2008 Tsukano et al.
(Continued)

FOREIGN PATENT DOCUMENTS

CN 101473446 A 7/2009
EP 0533551 A1 3/1993
(Continued)

*Primary Examiner* — Thanh T Nguyen
(74) *Attorney, Agent, or Firm* — Murphy, Bilak & Hommiller, PLLC

(57) ABSTRACT

Providing a solid body to be split into a number of layers of solid material, introducing or generating defects in the solid body in order to determine a first detachment plane (8) along which a first layer of solid material is separated from the solid body, providing a receiving layer for holding the layer of solid material on the solid body, applying heat to the receiving layer in order to generate, in particular mechanically, stresses in the solid body, due to the stresses a crack propagating in the solid body along the detachment plane, which crack separates the first layer of solid material from the solid body, then providing a second receiving layer for holding another layer of solid material on the solid body reduced by the first layer of solid material, introducing or generating defects in the solid body in order to determine a second detachment plane (9) along which a second layer of solid material is separated from the solid body, applying heat to the second receiving layer in order to generate, in particular mechanically, stresses in the solid body, due to the stresses a crack propagating in the solid body along the
(Continued)

Figure 2:
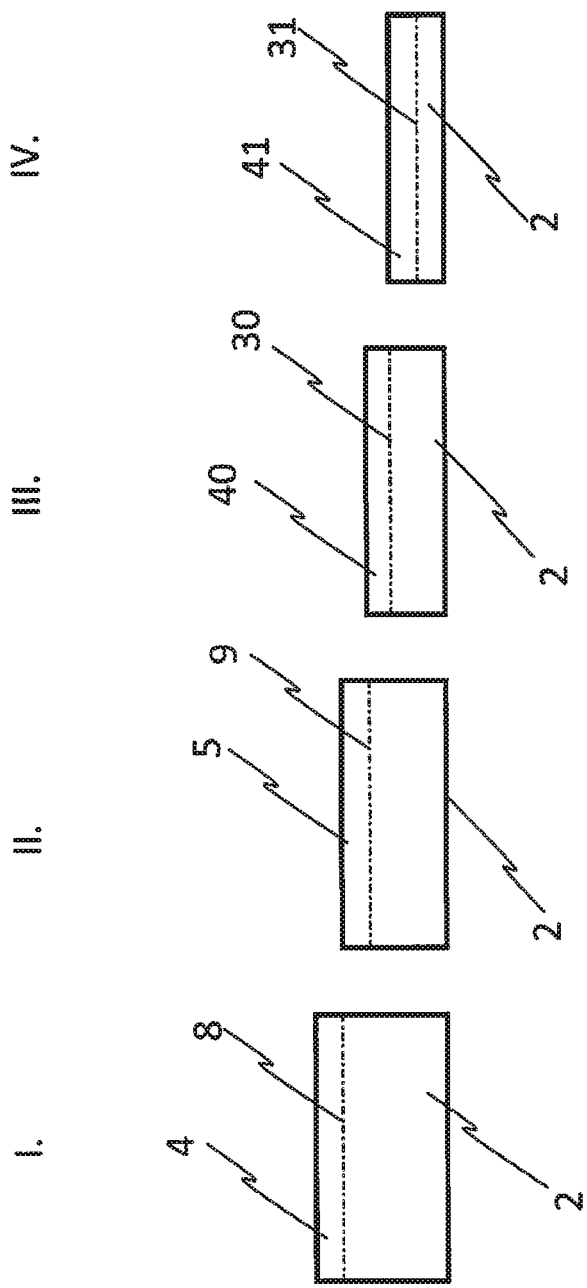

second detachment plane, which crack separates the second layer of solid material from the solid body.

18 Claims, 2 Drawing Sheets

Related U.S. Application Data continuation of application No. 15/028,303, filed as application No. PCT/EP2014/071506 on Oct. 8, 2014, now Pat. No. 10,141,219.

(51) Int. Cl.
| | | |
|---|---|---|
| *B23K 26/53* | (2014.01) | |
| *C30B 33/06* | (2006.01) | |
| *B28D 1/22* | (2006.01) | |
| *B23K 103/00* | (2006.01) | |

(52) U.S. Cl.
CPC .............. *B28D 1/221* (2013.01); *C30B 33/06* (2013.01); *H01L 21/76251* (2013.01); *B23K 2103/52* (2018.08)

(58) Field of Classification Search
CPC ............ B23K 2201/40; B23K 2203/56; B28D 1/221; C30B 33/06; H01L 21/268; H01L 21/683; H01L 21/6835; H01L 2221/68318; H01L 2221/68381; H01L 21/67092; H01L 21/187; H01L 21/2007; H01L 21/76251; H01L 21/76254; H01L 21/76259; H01L 33/0079; C09J 183/06; C09J 183/08
See application file for complete search history.

(56) References Cited

U.S. PATENT DOCUMENTS

| | | | |
|---|---|---|---|
| 2010/0289189 A1* | 11/2010 | Lichtensteiger | .... H01L 31/1896 264/492 |
| 2012/0234887 A1 | 9/2012 | Henley et al. | |
| 2014/0038392 A1* | 2/2014 | Yonehara | .............. B81C 1/0038 438/463 |

FOREIGN PATENT DOCUMENTS

| | | |
|---|---|---|
| EP | 2551897 A1 | 1/2013 |
| TW | 200933703 A | 8/2009 |
| WO | 2008082723 A2 | 7/2008 |
| WO | 2009061353 A2 | 5/2009 |
| WO | 2010072675 A2 | 7/2010 |
| WO | 2013126927 A2 | 8/2013 |
| WO | 2013166381 A1 | 11/2013 |

* cited by examiner

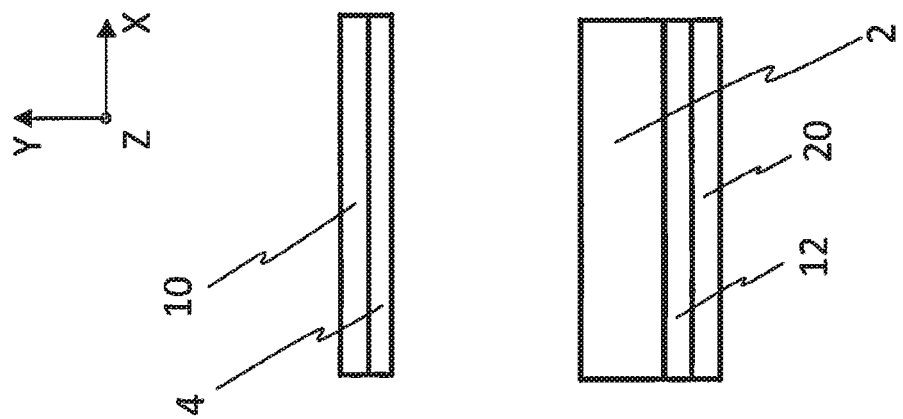
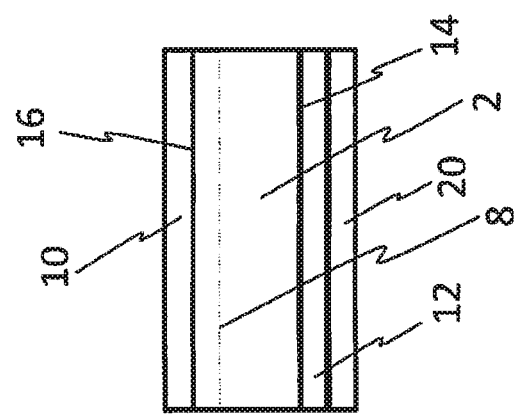
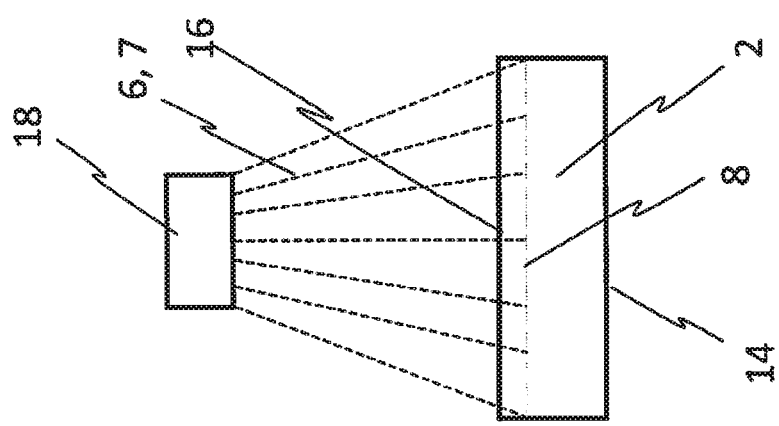
Fig. 1a
Fig. 1b
Fig. 1c

US 11,201,081 B2

METHOD FOR SEPARATING THIN LAYERS OF SOLID MATERIAL FROM A SOLID BODY

The present invention relates to a method for the production of layers of solid material according and to a wafer produced by this method.

In many technical domains (e.g. microelectronic or photovoltaic technology) materials, such as e.g. silicon, germanium or sapphire, are often needed in the form of thin discs and plates (so-called wafers). As standard, such wafers are currently produced by sawing from an ingot, relatively large material losses ("kerf loss") occurring. Since the source material used is often very expensive, great efforts are being made to produce such wafers with less material consumption and so more efficiently and inexpensively.

For example, with the currently normal methods almost 50% of the material used is lost as "kerf loss" when producing silicon wafers for solar cells alone. Considered globally, this corresponds to an annual loss of more than 2 billion euros. Since the cost of the wafer makes up the greatest percentage of the cost of the finished solar cell (over 40%), the cost of solar cells could be significantly reduced by making appropriate improvements to the wafer production.

Methods which dispense with the conventional sawing and can separate thin wafers directly from a thicker workpiece, e.g. by using temperature-induced stresses, appear to be particularly attractive for this type of wafer production without kerf loss ("kerf-free wafering"). These include in particular methods as described e.g. in PCT/US2008/012140 and PCT/EP2009/067539 where a polymer layer applied to the workpiece is used in order to produce these stresses.

In the aforementioned methods the polymer layer has a thermal expansion coefficient that is higher by approximately two orders of magnitude in comparison to the workpiece. Moreover, by utilising a glass transition a relatively high elasticity modulus can be achieved in the polymer layer so that sufficiently large stresses can be induced in the polymer layer workpiece layer system by cooling in order to enable the separation of the wafer from the workpiece.

Upon separating a wafer from the workpiece, in the aforementioned methods polymer still adheres to a respective side of the wafer. The wafer bends here very strongly towards this polymer layer, and this makes it difficult to execute the separation in a controlled manner, and may lead e.g. to variations in the thickness of the separated wafer. Moreover, the strong curvature makes subsequent processing difficult and may even lead to the wafer shattering.

When using the methods according to the previous prior art, the wafers produced generally have respectively larger thickness variations, the spatial thickness distribution often showing a pattern with four-fold symmetry. The total thickness variation seen over the entire wafer ("total thickness variation", TTV) is often more than 100% of the average wafer thickness when using the previous methods (a wafer with an average thickness of, for example, 100 micrometres, that is e.g. 50 micrometres thick at its thinnest point and 170 micrometres thick at its thickest point, has a TTV of 170–50=120 micrometres, which corresponds to a total thickness variation of 120% relative to its average thickness). Wafers with these strong thickness variations are unsuitable for many applications. Moreover, with the most frequently occurring four-fold thickness distribution patterns, the regions with the greatest variations unfortunately lie in the middle of the wafer where they cause the greatest disruption.

Moreover, in the method according to the current prior art, undesirable oscillations in the layer systems involved occur during the break propagation upon separation, and these oscillations have a negative impact upon the development of the break front and may in particular lead to significant thickness variations of the separated wafer.

In addition, with the previous methods it is difficult to ensure reproducibly good heat contact over the entire surface of the polymer layer. Locally insufficient heat contact may, however, lead to undesirable significant local temperature variations in the layer system due to the low thermal conductivity of the polymers used, and this on its part has a negative impact upon the controllability of the stress fields produced and so upon the quality of the wafers produced.

An alternative method, which also gets by without any sawing, is described by publication DE 692 31 328 T2. According to this publication, by means of ion implantation $H^+$ ions with 150 keV are introduced into a monocrystalline silicon plate. These $H^+$ ions are introduced into the silicon plate in a controlled manner such that they come to lie substantially on a defined plane within the plate. The dose of $H^+$ ions implanted here is greater than $10^{16}$ cm$^{-2}$, by means of which, as the result of heating the silicon plate to a temperature of greater than 500° C., coalescence of the ions that have been introduced is brought about, and this leads to separation of the portions of the silicon plate that are adjacent to the plane of the ions that have been introduced.

This method is very costly and complex because an extremely expensive ion cannon with a corresponding control device has to be provided. Furthermore, the implantation of the ions takes a very long time due to the high dose. In addition, the heating of the silicon plate requires the use of a large amount of energy and prevents electrical components that would be damaged at such high temperatures from being placed on the silicon plate before the heating.

It is therefore the object of the present invention to provide a method for the production of layers of solid material that enables the inexpensive production of plates made of solid materials or wafers with an even thickness, in particular with a TTV of less than 120 micrometres.

The aforementioned object is achieved by a method for the production of layers of solid material. The method comprises at least the following steps: providing a solid body to be split into a number of layers of solid material, introducing or generating defects in the solid body in order to determine a first detachment plane along which a first layer of solid material is separated from the solid body, providing a receiving layer for holding the layer of solid material on the solid body, applying heat to the receiving layer in order to generate, in particular mechanically, stresses in the solid body, due to the stresses a crack propagating in the solid body along the detachment plane, which crack separates the first layer of solid material from the solid body, then providing a second receiving layer for holding another layer of solid material on the solid body reduced by the first layer of solid material, introducing or generating defects in the solid body in order to determine a second detachment plane along which a second layer of solid material is separated from the solid body, applying heat to the second receiving layer in order to generate, in particular mechanically, stresses in the solid body, due to the stresses a crack propagating in the solid body along the second detachment plane, which crack separates the second layer of solid material from the solid body.

The step of generating a detachment plane and the step of applying an additional receiving layer as well as the step of applying heat to the polymer layer disposed on the solid body in order to generate, in particular mechanically, stresses in the solid body can be repeated or implemented as many times as one wishes. Preferably, by means of the method according to the invention, more than or precisely three, four, five, six, seven, eight, nine, ten, fifteen, twenty, twenty-five or thirty layers of solid material or wafers are separated from the solid body. Only the thickness or the axial length of the solid body and the thicknesses or axial lengths of the separated layers determine a limit for the maximum number of repetitions here.

This solution is advantageous because a number of layers of solid material can advantageously be separated, in particular be split off, from a solid body. The introduction or generation of defects causes the generation of a predetermined breakage plane or a guide for a crack initiated and/or directed by means of the stresses. The TTV of the layers of solid material that are generated can be reduced by the method according to the invention to such an extent that more layers of solid material can be obtained from one solid body.

Additional preferred embodiments are the subject matter of the sub-claims and of the following description.

According to a preferred embodiment of the present invention the stresses for detaching the layer of solid material are generated by the solid body by applying heat to the respective receiving layer, in particular the respective polymer layer. The application of heat preferably constitutes cooling of the receiving layer or polymer layer at or below ambient temperature, and preferably below 10° C. and particularly preferably below 0° C. and more preferably below −10° C. Extremely preferably, the cooling of the polymer layer/s takes place such that at least part of the polymer layer, which is preferably made of PDMS, undergoes a glass transition. In this connection the cooling can be cooling to below −100° C. which can be brought about e.g. by means of liquid nitrogen. This embodiment is advantageous because the polymer layer contracts depending on the temperature change and/or undergoes a glass transition, and transfers the forces thus produced to the solid body, by means of which mechanical stresses can be generated in the solid body which lead to the initiation of a crack and/or crack propagation, the crack first of all propagating along the first detachment plane in order to split off the layer of solid material.

According to one preferred embodiment of the present invention, respectively after the step of applying heat to the polymer layer in order to generate stresses in order to detach the first layer of solid material and before the step of introducing or generating defects in the solid body in order to determine a second detachment plane, the surface of the solid body exposed by the separation of the first layer of solid material is machined. This machining step can always take place after applying heat to the polymer layer in order to generate stresses so as to detach a layer of solid material and before introducing or generating defects in the solid body in order to determine another detachment plane. Due to the advantageous method according to the invention, only very small, if any, components of the solid body need be reworked or ground down. Nevertheless, this machining step leads to very level surface, and so to the improved introduction or generation of defects within the structure of the solid body.

According to another preferred embodiment of the present invention, the introduction of defects is brought about by introducing ions, a radiation source being provided in order to supply the ions to be introduced into the solid body, the radiation source being aligned such that the ions irradiated from it penetrate into the solid body. This embodiment is advantageous because, in conjunction with the stress-induced crack propagation and crack initiation, it is clearly more convenient, faster and more energy-efficient than the generation of layers of solid material based purely on the implantation of ions. Furthermore, with this method more solid bodies made of different materials can be divided into layers of solid material because the process temperature is clearly lower. Another advantage of the invention is that, due to the implanted ions, the detachment plane or a defect layer can be generated in the solid body by means of which the crack or the crack propagation is managed or directed, and this makes it possible to produce very small TTVs, in particular smaller than 100 micrometres or smaller than 80 micrometres or smaller than 60 micrometres or smaller than 40 micrometres or smaller than 20 micrometres or smaller than 10 micrometres or smaller than 5 micrometres. The ion implantation thus creates a type of perforation within the solid body, along which the crack propagation takes place or along which the layer of solid material is separated from the solid body. At least or precisely one radiation source is therefore preferably aligned such that the ions irradiated from it penetrate into the solid body. The radiation source preferably serves to provide $H^+$ ions or noble gas ions such as e.g. the substances helium, neon, krypton and xenon, the ions of the remaining non-specified noble gases also being able to be used. Furthermore, it is conceivable for the ions of the substances specified above and/or of additional substances to be used separately or in combination, or simultaneously or one after the other.

According to another preferred embodiment of the present invention, a predetermined dose of ions is applied to the solid body, the predetermined dose being less than $5+10^{16}$ cm$^{-2}$, less than $10^{15}$ cm$^{-2}$ or less than $10^{14}$ cm$^{-2}$ or less than $10^{13}$ cm$^{-2}$. This embodiment is advantageous because due to the small dose, defects are generated within the solid body that bring about advantageous crack direction, but the implantation time is relatively short. In addition or alternatively, the solid body is tempered such that coalescence of the ions introduced into the solid body is prevented. In general, coalescence means the flowing together of colloidal particles. In this connection, particles or ions that are finely distributed within the dispersion medium (solid body) are called colloids. This embodiment is advantageous because not only temperature-stable solids, but also temperature-critical solids or solids with temperature-critical components, such as e.g. electronic components that may be damaged at temperatures of higher than 50° C. or higher than 100° C. or higher than 200° C. or higher than 300° C. or higher than 400° C. or higher than 500° C. can be processed.

According to another preferred embodiment of the present invention the generation of defects is brought about by at least one radiation source in the form of a laser, the rays irradiated by the radiation source generating the defects at predetermined locations within the solid body. This embodiment is advantageous because, due to the radiation source the detachment layer or the detect layer can be generated in the solid body, by means of which layer the crack or crack propagation is managed or directed, and this makes it possible to produce very precisely very small TTVs, in particular smaller than 100 micrometres or smaller than 80 micrometres or smaller than 60 micrometres or smaller than 40 micrometres or smaller than 20 micrometres or smaller than 10 micrometres or smaller than 5 micrometres. Therefore, the exposure of the wafer or the layer of solid material to rays creates a type of perforation within the solid body, along which the crack propagation takes place and along which the layer of solid material is separated from the solid body.

According to another preferred embodiment of the present invention the radiation source (e.g. in the form of an ion cannon or a laser) is set up such that the rays irradiated by it in order to generate the detachment plane penetrate into the solid body to a defined depth, in particular <100 μm. Preferably, the detachment plane is formed in parallel, spaced apart from an outer and preferably level surface of the solid body. Preferably, the detachment plane is less than 100 micrometres and preferably less than 50 micrometres and particularly preferably less than or precisely 20, 10, 5 or 2 micrometres away from the level surface of the solid body within the solid body.

According to another preferred embodiment of the present invention the solid body comprises silicon and/or gallium and/or a ceramic material, in particular a perovskite material, and the receiving layer is preferably made of a polymer layer, the polymer layer and/or the holding layer being made at least partially, and preferably entirely, or by more than 75% of polydimethylsiloxane (PDMS), the holding layer being disposed on an at least partially level surface of a stabilisation device which is made at least partially of at least one metal. The stabilisation device is preferably a plate, in particular a plate that comprises aluminium or is made of the latter. This embodiment is advantageous because by means of the stabilisation device and the holding layer the solid body is defined and held securely, by means of which the stresses can be generated very precisely in the solid body.

According to another preferred embodiment of the present invention the stresses in the solid body can be set up or generated such that the crack initiation and/or the crack propagation can be controlled in order to generate a topography of the surface that is produced in the crack plane. Therefore, the stresses can preferably be generated in different regions of the solid body such as to be of different strengths, at least from time to time. This embodiment is advantageous because by controlling the crack initiation and/or the crack development, the topography of the layer of solid material that is generated or separated can advantageously be influenced.

The solid body preferably comprises a material or a material combination of one of the main groups 3, 4 and 5 of the periodic table of the elements, such as e.g. Si, SiC, SiGe, Ge, GaAs, InP, GaN, $Al_2O_3$ (sapphire), AlN. Particularly preferably, the solid body has a combination of elements occurring in the third and the fifth group of the periodic table. Conceivable materials or material combinations here are e.g. gallium arsenide, silicon, silicon carbide etc., Furthermore, the solid body can comprise a ceramic (e.g. $Al_2O_3$—aluminium oxide) or be made of a ceramic, preferred ceramics here being e.g. perovskite ceramics (such as e.g. ceramics containing Pb, O, Ti/Zr) in general and lead magnesium niobates, barium titanate, lithium titanate, yttrium aluminium garnet, in particular yttrium aluminium garnet crystals for solid body laser applications, SAW (Surface Acoustic Wave) ceramics, such as e.g. lithium niobate, gallium orthophosphate, quartz, calcium titanate, etc. in particular, Therefore, the solid body preferably comprises a semiconductor material or a ceramic material, or particularly preferably the solid body is made of at least one semiconductor material or a ceramic material. Furthermore, it is conceivable for the solid material to comprise a transparent material or to be made of or to be produced partially from a transparent material such as e.g. sapphire. Additional materials that can be considered here on their own or in combination with another material as a solid body material are e.g. "wide band gap" materials, InAlSb, high temperature superconductors, in particular rare earth cuprates (e.g. $YBa_2Cu_3O_7$).

The invention additionally relates to a wafer that is produced by a method.

Furthermore, the subject matter of publications PCT/US2008/012140 and PCT/EP2009/067539 is made complete by referring to the subject matter of the present patent application. Likewise, the subject matter of all of the other patent applications also submitted by the applicant on the application date of the present patent application and relating to the domain of the production of layers of solid material are in their entirety included in the subject matter of the present patent application.

Other advantages, aims and properties of the present invention are explained by means of the following description of the attached drawings in which the wafer production according to the invention is shown as an example. Components or elements of the wafer production according to the invention which in the figures correspond, at least substantially with regard to their function, can be identified here by the same reference signs, these components or elements not having to be numbered or explained in all of the figures.

Individual or all of the illustrations of the figures described below are preferably to be considered as design drawings, i.e. the dimensions, proportions, functional relationships and/or arrangements shown by the figures preferably correspond precisely or preferably substantially to those of the apparatus according to the invention or of the product according to the invention.

The figures show as follows:

FIG. 1a a diagrammatic construction for generating defects in a solid body;

FIG. 1b a diagrammatic illustration of a layer arrangement before separating a layer of solid material from a solid body;

FIG. 1c a diagrammatic illustration of a layer arrangement after separating a layer of solid material from a solid body; and FIG. 2 the separation of a number of layers of solid material from a solid body.

FIG. 1a shows a solid body 2 or a substrate that is disposed in the region of a radiation source 18, in particular a laser or an ion cannon. The solid body 2 preferably has a first level surface portion 14 and a second level surface portion 16, the first level surface portion 14 preferably being aligned substantially or exactly parallel to the second level surface portion 16. The first level surface portion 14 and the second level surface portion 16 preferably delimit the solid body 2 in a Y direction that is preferably aligned vertically or perpendicularly. The level surface portions 14 and 16 preferably extend respectively in an X-Z plane, the X-Z plane preferably being aligned horizontally. Furthermore, it can be gathered from this illustration that the radiation source 18 irradiates ions 6 or rays 7 onto the solid body 2. If the radiation source 18 is in the form of an ion source 6 the ions 6 penetrate by a defined depth into the solid body 2 depending on the configuration and remain here. If the radiation source 18 is in the form of a laser, the rays 6 or light waves penetrate into the solid body and generate a defect at a predetermined position.

FIG. 1b shows a multi-layered arrangement, the solid body 2 containing the detachment plane 8 and being provided in the region of the first level surface portion 14 with a holding layer 12 which is in turn preferably overlaid by an additional layer 20, the additional layer 20 preferably being a stabilisation device, in particular a metal plate, A polymer layer 10 is preferably disposed on the second level surface portion 16 of the solid body 2. The polymer layer 10 and/or the holding layer 12 are preferably made at least partially and particularly preferably entirely of PDMS.

FIG. 1c shows a state after a crack initiation and subsequent crack direction. The layer of solid material 4 adheres to the polymer layer 10 and is or can be spaced apart from the remaining part of the solid body 2. Before or after an additional introduction or generation of a defect within the solid body 2 an additional polymer layer is preferably additionally applied to the surface of the solid body 2 that is exposed by splitting off the first layer of solid material 4. Preferably, after each separation of a layer of solid material 4, 5 from the solid body 2, a polymer layer is applied to the exposed surface of the solid body 2, in particular so long as the residual thickness of the solid body 2 is still suitable for separation into two wafers.

In FIG. 2 four different diagrammatic illustrations of a solid body 2 are shown. In each illustration the solid body 2 has a different axial length (in the Y direction), The length of the solid body 2 changes from illustration I. to illustration IV. such that it becomes shorter and shorter because a layer of solid material 4, 5, 40 is always removed from I.-IV., i.e. the solid body 2 shown in II. is shortened by the layer of solid material 4 shown in I. because this first layer of solid material 4 has been separated or detached along the detachment plane. In IV. The solid body 2 forms a length that preferably or substantially allows the separation into two layers of solid material that preferably have a comparable length (in the Y direction) to the layers of solid material 4, 5 previously separated from the solid body 2.

It is conceivable here for the solid body 2 to be treated with a grinding process after the separation of a layer of solid material 4, by means of which there is also an axial length reduction of the solid body. The axial length reduction of the solid body 2 brought about by the grinding can not be gathered from the illustration however.

Therefore, the invention relates to a method for producing layers of solid material 4. This production method preferably includes at the very least the following steps: providing a solid body 2 to be split into a number of layers of solid material 4, introducing or generating defects in the solid body 2 in order to determine a first detachment plane 8 along which a first layer of solid material 4 is separated from the solid body 2, providing a receiving layer 10 for holding the layer of solid material 4 on the solid body 2, applying heat to the receiving layer 10 in order to generate, in particular mechanically, stresses in the solid body 2, due to the stresses a crack propagating in the solid body 2 along the detachment plane 8, which crack separates the first layer of solid material 4 from the solid body 2, providing a second receiving layer for holding another layer of solid material 5 on the solid body 2, introducing or generating defects in the solid body 2 in order to determine a second detachment plane 9 along which a second layer of solid material 5 is separated from the solid body 2, applying heat to the second receiving layer in order to generate, in particular mechanically, stresses in the solid body 2, due to the stresses a crack propagating in the solid body 2 along the second detachment plane 9, which crack separates the second layer of solid material 5 from the solid body 2.

LIST OF REFERENCE SIGNS 2 solid body
4 first layer of solid material
5 second layer of solid material
6 ions
7 rays
8 first detachment plane
9 second detachment plane
10 polymer layer
12 holding layer
14 first level surface portion
16 second level surface portion
18 radiation source
20 stabilisation device
30 additional detachment plane
31 another additional detachment plane
40 additional layer of solid material
41 another additional layer of solid material
X first direction
Y second direction
Z third direction

What is claimed is:

1. A method for producing layers of solid material, the method comprising:
   introducing or generating defects in a solid body to define a first detachment plane along which a first layer of solid material is to be separated from the solid body;
   applying a first polymer layer to the first layer of solid material on the solid body;
   cooling the first polymer layer such that at least part of the first polymer layer undergoes a glass transition to generate stresses in the solid body, the stresses causing a first crack to propagate in the solid body along the first detachment plane, wherein the first layer of solid material is separated from the solid body along the first crack;
   after separating the first layer of solid material from the solid body, introducing or generating defects in the solid body to define a second detachment plane along which a second layer of solid material is to be separated from the solid body;
   applying a second polymer layer to the second layer of solid material on the solid body;
   cooling the second polymer layer such that at least part of the second polymer layer undergoes a glass transition to generate stresses in the solid body, the stresses causing a second crack to propagate in the solid body along the second detachment plane, wherein the second layer of solid material is separated from the solid body along the second crack.

2. The method of claim 1, further comprising:
   after cooling the first polymer layer and before introducing or generating the defects in the solid body to define the second detachment plane, machining a surface of the solid body exposed by separating the first layer of solid material from the solid body.

3. The method of claim 1, wherein introducing or generating the defects in the solid body to define the first detachment plane and/or the second detachment plane comprises:
   introducing ions via a radiation source; and
   aligning the radiation source such that the ions penetrate into the solid body.

4. The method of claim 3, wherein the radiation source is aligned such that the ions penetrate the solid body to a defined depth.

5. The method of claim 4, wherein the defined depth is less than 100 µm.

6. The method of claim 3, wherein introducing the ions comprises:

applying a predetermined dose of the ions to the solid body, the predetermined dose being less than $10^{15}$ cm$^{-2}$; and tempering the solid body to prevent coalescence of the ions within the solid body.

7. The method of claim 1, wherein introducing or generating the defects in the solid body to define the first detachment plane and/or the second detachment plane comprises:

introducing laser rays from a radiation source into the solid body at predetermined locations.

8. The method of claim 7, wherein the radiation source is configured such that the laser rays penetrate the solid body to a defined depth of less than 100 μm.

9. The method of claim 7, wherein the radiation source is configured such that the laser rays penetrate the solid body to a defined depth of less than 50 μm.

10. The method of claim 7, wherein the radiation source is configured such that the laser rays penetrate the solid body to a defined depth of less than 20 μm.

11. The method of claim 1, wherein the solid body comprises silicon and/or gallium and/or a ceramic material.

12. The method of claim 1, wherein the first polymer layer and/or the second polymer layer is made at least partially of PDMS.

13. The method of claim 1, further comprising:

disposing at least one of the first polymer layer and the second polymer layer on an at least partially level surface of a stabilization device made at least partially of at least one metal.

14. The method of claim 1, further comprising:

controlling the stresses in the solid body such that crack initiation and/or crack propagation within the solid body generates a defined topography of a surface produced along the first crack and/or along the second crack.

15. A method for producing layers of solid material, the method comprising:

introducing or generating defects in a solid body to define a first detachment plane along which a first layer of solid material is to be separated from the solid body;

providing a first receiving layer for holding the first layer of solid material on the solid body;

applying heat to the first receiving layer to generate stresses in the solid body, the stresses causing a first crack to propagate in the solid body along the first detachment plane, wherein the first layer of solid material is separated from the solid body along the first crack;

after separating the first layer of solid material from the solid body, introducing or generating defects in the solid body to define a second detachment plane along which a second layer of solid material is to be separated from the solid body;

providing a second receiving layer for holding the second layer of solid material on the solid body;

applying heat to the second receiving layer to generate stresses in the solid body, the stresses causing a second crack to propagate in the solid body along the second detachment plane, wherein the second layer of solid material is separated from the solid body along the second crack, wherein introducing or generating the defects in the solid body to define the first detachment plane and/or the second detachment plane comprises:

introducing ions via a radiation source; and aligning the radiation source such that the ions penetrate into the solid body.

16. The method of claim 15, wherein the radiation source is aligned such that the ions penetrate the solid body to a defined depth.

17. The method of claim 16, wherein the defined depth is less than 100 μm.

18. The method of claim 15, wherein introducing the ions comprises:

applying a predetermined dose of the ions to the solid body, the predetermined dose being less than $10^{15}$ cm$^{-2}$; and tempering the solid body to prevent coalescence of the ions within the solid body.

* * * * *